(12) United States Patent
Jacobs

(10) Patent No.: US 12,021,156 B2
(45) Date of Patent: Jun. 25, 2024

(54) WINDOWED WAFER ASSEMBLIES HAVING INTERPOSERS

(71) Applicant: Texas Instruments Incorporated, Dallas, TX (US)

(72) Inventor: Simon Joshua Jacobs, Lucas, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 7 days.

(21) Appl. No.: 16/588,592

(22) Filed: Sep. 30, 2019

(65) Prior Publication Data

US 2021/0098635 A1    Apr. 1, 2021

(51) Int. Cl.
| | |
|---|---|
| H01L 31/02 | (2006.01) |
| H01L 31/0203 | (2014.01) |
| H01L 31/0232 | (2014.01) |
| H01L 31/18 | (2006.01) |

(52) U.S. Cl.
CPC .... *H01L 31/02002* (2013.01); *H01L 31/0203* (2013.01); *H01L 31/02327* (2013.01); *H01L 31/18* (2013.01)

(58) Field of Classification Search
CPC ........... H01L 31/02002; H01L 31/0203; H01L 31/02327; H01L 31/18
See application file for complete search history.

(56) References Cited

U.S. PATENT DOCUMENTS

| | | | | |
|---|---|---|---|---|
| 9,922,845 B1 * | 3/2018 | Shih | ..................... | H01L 23/5226 |
| 2004/0262742 A1 * | 12/2004 | DiStefano | ............ | H05K 3/4084 |
| | | | | 257/706 |
| 2014/0048906 A1 * | 2/2014 | Shim | ..................... | H01L 25/105 |
| | | | | 257/531 |
| 2014/0084955 A1 * | 3/2014 | Teng | .................. | G01R 1/07378 |
| | | | | 324/756.03 |
| 2015/0250058 A1 * | 9/2015 | Ramachandran | ... | H01L 27/0688 |
| | | | | 361/748 |

(Continued)

OTHER PUBLICATIONS

Matsuzaki et al., "Multi-wafer Bonding, Stacking and Interconnecting of Integrated 3-D MEMS Micro Scanners," International Journal of Microwave and Optical Technology, vol. 9, Jan. 1, 2014, pp. 128-133.

(Continued)

*Primary Examiner* — Fernando L Toledo
*Assistant Examiner* — Neil R Prasad
(74) *Attorney, Agent, or Firm* — Michelle F. Murray; Frank D. Cimino

(57) ABSTRACT

Windowed wafer assemblies having interposers are described. A described example integrated circuit (IC) package includes first and second dies, where at least one of the first or second dies includes an optical window with a light transmittance wavelength range between 0.1 micrometers and 1.0 millimeter, and an interposer die between the first and second dies, where the interposer die is coupled to the first die at a first surface of the interposer to form a first bonded interface, where the interposer is coupled to the second die at a second surface of the interposer die to form a second bonded interface, where the second surface is opposite the first surface, where the first and second bonded interfaces form a sealed cavity of the IC package that is at least partially formed by the optical window, and where the interposer die includes electrical routing.

19 Claims, 8 Drawing Sheets

(56) References Cited

U.S. PATENT DOCUMENTS

| | | | | |
|---|---|---|---|---|
| 2015/0259194 | A1* | 9/2015 | Lin | H01L 23/5389 |
| | | | | 257/773 |
| 2016/0043047 | A1* | 2/2016 | Shim | H01L 23/5389 |
| | | | | 438/126 |
| 2016/0090298 | A1* | 3/2016 | Sengupta | B81B 7/0048 |
| | | | | 438/51 |
| 2016/0300813 | A1* | 10/2016 | Zhai | H01L 23/5389 |
| 2017/0221858 | A1* | 8/2017 | Yu | H01L 25/105 |
| 2020/0051883 | A1* | 2/2020 | Huang | B81C 1/00317 |
| 2020/0091128 | A1* | 3/2020 | Elsherbini | H01L 24/17 |

OTHER PUBLICATIONS

Matsuzaki et al., "Anodic Bonding Between LTTC Wafer and Si Wafer with Sn—Cu-Based Electrical Connection," Electronics and Communications in Japan, vol. 95, No. 4, Mar. 21, 2012, pp. 49-56, (translated from Denki Gakkai Ronbunshi, vol. 131-E, No. 5, May 2011, pp. 189-194), 2 pages. English abstract included only.

Tanaka et al., "Wafer-level Hermetic Packaging Technology for MEMS Using Anodically-Bondable LTCC Wafter," Proceedings of IEEE MEMS, 2011, pp. 376-379, 2 pages. English abstract included only.

Yildiz et al., "Fabrication and Packaging of CMUT Using Low Temperature Co-Fired Ceramic," Micromachines, Oct. 27, 2008, 9, 553, pp. 1-17.

* cited by examiner

WINDOWED WAFER ASSEMBLIES HAVING INTERPOSERS

TECHNICAL FIELD

This relates generally to integrated circuit (IC) packages and, more particularly, to windowed wafer assemblies having interposers.

BACKGROUND

Interposers are structures that are coupled to wafers. In particular, the interposers can be positioned between wafers to provide mechanical support and/or act as a standoff between the wafers. As a result, the interposers provide structural rigidity and mechanical support.

SUMMARY

In described examples of an integrated circuit (IC) package, the IC package includes first and second dies, where at least one of the first or second dies includes an optical window with a light transmittance wavelength range between 0.1 micrometers and 1.0 millimeter, and an interposer die between the first and second dies, where the interposer die is coupled to the first die at a first surface of the interposer to form a first bonded interface, where the interposer is coupled to the second die at a second surface of the interposer die to form a second bonded interface, where the second surface is opposite from the first surface, where the first and second bonded interfaces form a sealed cavity of the IC package that is at least partially formed by the optical window, and where the interposer die includes electrical routing.

In described examples of a method of producing an optical wafer assembly, the method includes coupling a first wafer to a first surface of an interposer to form a first bonded interface coupling a second wafer to a second surface of the interposer to form a second bonded interface, the second surface on an opposite side from the first surface, where at least one of the first or second dies includes an optical window with a light transmittance wavelength range of between 0.1 micrometers and 1.0 millimeter, where the first and second bonded interfaces are sealed to form sealed cavities that are at least partially formed by the optical window, and where the interposer includes electrical routing.

In described examples of a wafer assembly, the wafer assembly includes a first wafer, a second wafer, where at least one of the first or second wafers includes an optical wafer with a light transmittance wavelength range between 0.1 micrometers and 1.0 millimeter, and an interposer coupled to the first and second wafers at respective first and second surfaces of the interposer, where the second surface is opposite the first surface, and where the interposer includes electrical routing. The example wafer assembly also includes a first bonded interface between the first wafer and the interposer, and a second bonded interface between the second wafer and the interposer, where the first and second bonded interfaces form sealed cavities that are at least partially formed by the optical wafer.

DETAILED DESCRIPTION

Figure 1A:
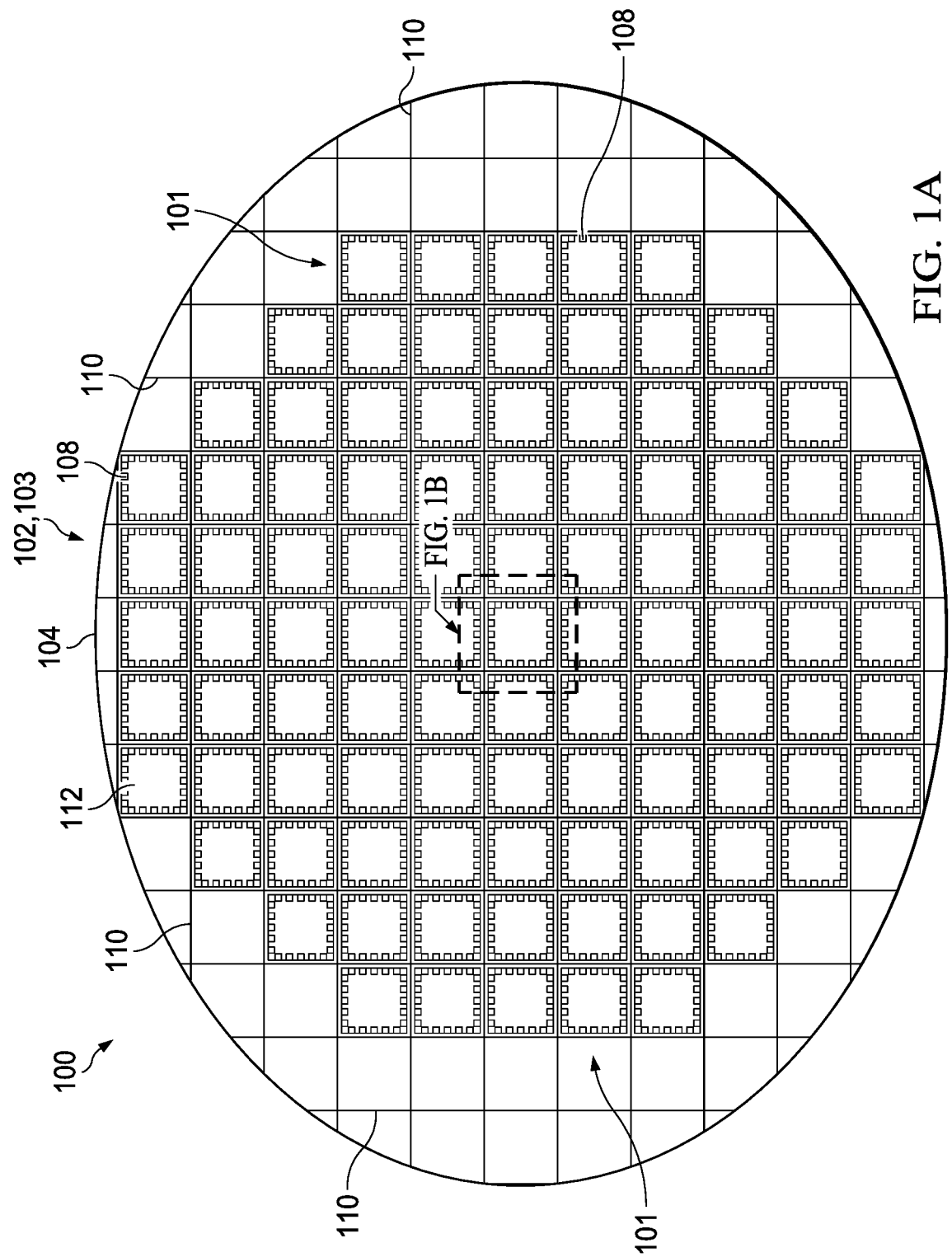
FIG. 1A is a top view of an example optical wafer assembly in accordance with teachings of this disclosure.

The figures are not to scale. Instead, the thickness of the layers or regions may be enlarged in the drawings. In general, the same reference numbers will be used throughout the drawing(s) and accompanying written description to refer to the same or like parts. As used in this patent, stating that any part (e.g., a layer or area) is in any way on (e.g., positioned on, located on, disposed on, or formed on, etc.) another part, indicates that the referenced part is either in contact with the other part, or that the referenced part is above the other part with one or more intermediate part(s) located therebetween. Stating that any part is in contact with another part means that there is no intermediate part between the two parts. Although the figures show layers and regions with clean lines and boundaries, some or all of these lines and/or boundaries may be idealized. In reality, the boundaries and/or lines may be unobservable, blended, and/or irregular.

As used herein, the term "above" is used with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate. Likewise, as used herein, a first component is "below" another component when the first component is closer to the bulk region of the semiconductor substrate. As noted above, one component can be above or below another with other components therebetween or while being in direct contact with one another.

Windowed wafer assemblies having interposers are described. Interposers are implemented as mechanical standoffs and/or couplings between two wafers (e.g., fabricated wafers). In particular, the interposers are placed between two wafers to operatively couple the two wafers together, thereby defining a wafer assembly. Subsequently, the wafer assembly can be singulated and/or cut into discrete IC packages (e.g., discrete die). To provide electrical coupling to a die in some known examples, the die is subdivided from the wafer assembly and attached to a substrate. In turn, a wire bonding process is used to electrically couple the die to bond pads of the substrate using wire bonds. Further, in some known examples, the wire bonds are encapsulated to prevent mechanical damage. These processes, however, can be time-consuming and expensive.

Example described herein enable electrically-active interposers with integrated electrical routing. These interposers are to be bonded to at least one optical window wafer, thereby reducing (e.g., eliminating) a need to couple, wire bond and encapsulate a die, thereby saving associated time and costs. Examples described herein implement an active interposer (e.g., an interposer layer) having electrical routing disposed within. The interposer is coupled to a first wafer (e.g., a wafer chip) via a first bonded interface at a first side of the interposer and a second wafer (e.g., an optical window) via a second bonded interface at a second side of the interposer that is opposite of the first side. The first and second bonded interfaces along with the interposer form a sealed cavity (e.g., a hermetically sealed cavity, a substantially gas impermeable seal, etc.) and electrical routing within the interposer is electrically coupled to at least one of the first or second wafers. In other words, the interposer enables additional area/volume for electrical routing, as well as increased functionality while providing mechanical support. Accordingly, examples described herein enable wafer-level chip-scale packages and multi-die stacking.

In some examples, the active interposer includes electrical devices (e.g., fabricated electrical devices, diodes, transistors, etc.) disposed and/or embedded within. For example, the electrical devices can be coupled to the aforementioned electrical routing of the interposer. In some examples, the interposer is at least partially composed of silicon (e.g., a single crystal form or a polycrystalline form, a silicon semiconductor having at least one oxidized surface, etc.). In other examples, the interposer is a at least partially composed of ceramic (e.g., a co-fired ceramic material or body, a low temperature co-fired ceramic, etc.).

As used herein, the term "interposer" refers to a structure that is coupled to at least one wafer and/or disposed between wafers. As used herein, the term "wafer assembly" refers to an assembly including at least one wafer and an interposer. As used herein, the term "die" refers to a portion of a wafer and/or a layer of the wafer that has been cut and/or singulated from the wafer and/or the layer. In other words, the term "die" can also refer to a portion of a layer or wafer that is singulated from a wafer assembly. As used herein, the term "optical window" refers to a layer, an opening in a surface and/or a body that is at least semi-translucent and allows light to travel therethrough.

FIG. 1A is a top view of an example optical wafer assembly (e.g., a wafer stack, a bonded wafer stack, a bonded assembly, etc.) 100 in accordance with teachings of this disclosure. In particular, the optical wafer assembly 100 is shown having an interposer 101 laterally extending as a lattice structure (in the view of FIG. 1A) and positioned between a first wafer 102 and a second wafer 103 (shown transparent for clarity), both of which are stacked in a direction into the page of FIG. 1. In particular, the first wafer 102 and the second wafer 103 have an outer shape formed shown as a perimeter 104. Further, the interposer 101 includes pads (e.g., electrical contact pads, land grid array (LGA) pads, ball grid array (BGA) pads, etc.) 108 and cutting perimeter lines (e.g., cutting lines, cutting borders, scoring edges, etc.) 110. Further, the optical wafer assembly 100 includes die portions 112, which are portions or sections of the optical wafer assembly 100 to be separated into individual die.

In the illustrated example of FIG. 1A, the interposer 101 is coupled and/or bonded to both the first wafer 102 and the second wafer 103. In particular, the interposer 101 is mounted to the first wafer 102 on a first side or surface of the interposer 101 and mounted to the second wafer 103 on a second side or surface of the interposer 101. In other words, the interposer 101 forms a mechanical support and/or standoff between the first and second wafers 102, 103 in this example. According to examples described herein, the interposer 101 also includes electrical routing disposed within (e.g., routed through, buried conductor layers and/or vias within a substrate of the interposer 101). The aforementioned electrical routing can be used to provide electrical flow paths between one or more of the first and second wafers 102, 103. As a result, the electrical routing couples electrical components of at least one of the first or second wafers 102, 103 together. In some examples, the electrical routing electrically couples the first and second wafers 102, 103 to one another (e.g., provides electrical routing between the first and second wafers 102, 103 disposed on opposite sides or surfaces of the interposer 101).

In some examples, the interposer 101 includes active electrical components (e.g., fabricated electrical components). In particular, the active electrical components can be embedded (e.g., embedded via a fabrication process, etc.) within the interposer 101 to drive reset voltages, sense a package environment and/or any other desired functionality. In some examples, the interposer 101 is at least partially composed of ceramic (e.g., a ceramic substrate). Additionally or alternatively, the interposer 101 is at least partially composed of silicon.

While the interposer 101 is depicted as generally extending across the perimeter 104, which generally exhibits a round (e.g., circular, elliptical, etc.) overall shape in this example, the interposer 101 and/or the first and second wafers 102, 103 can be implemented as any appropriate shape (e.g., rectangular, triangular, pentagonal, hexagonal, octagonal, polygonal, elliptical, etc.). In some examples, the interposer 101 only extends across a portion of the first and second wafers 102, 103 and/or the perimeter 104. In some examples, the perimeter 104 is formed by a ring (e.g., a gold ring for an electroplating contact) that is approximately 2-4 millimeters (mm) (e.g., 3 mm) wide. In some such examples, the ring is used for an electroplating contact to plate bond pads and seal ring metals.

Figure 1B:
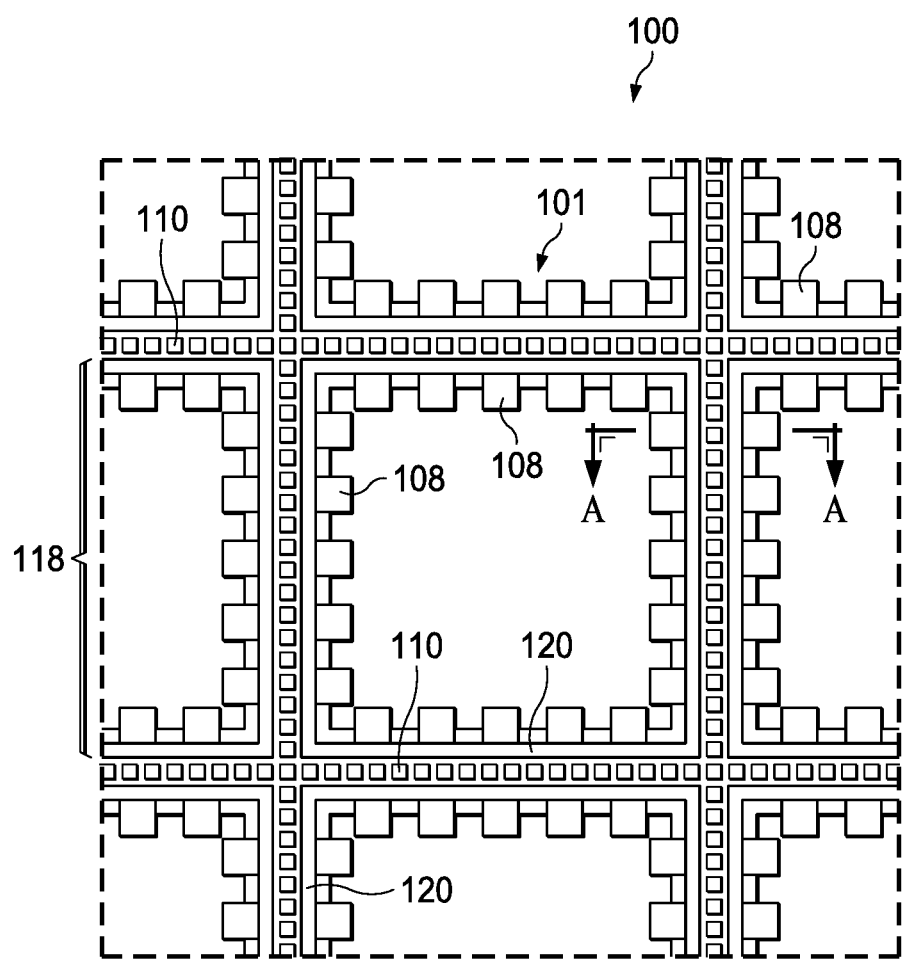
FIG. 1B is a detailed view of a portion of the example optical wafer assembly of FIG. 1A.

Referring to FIG. 1B, a detailed view of the optical wafer assembly 100 of FIG. 1A is shown. As can be seen in FIG. 1B, the interposer 101 is shown having multiple individual die portions 118 with the aforementioned pads 108. In this example, a perimeter (e.g., a perimeter pad, a seal ring) 120 of the interposer 101 is used to form a seal (e.g., a hermetic seal, a hermetic seal area, a hermetically encapsulated area, etc.) of each corresponding ones of the die portions 118. As mentioned above in connection with FIG. 1A, the example perimeter lines 110 form cutting edges and/or areas so that the die portions 118 can be separated from the optical wafer assembly 100 (e.g., during a singulation process of the optical wafer assembly 100).

Figure 2:
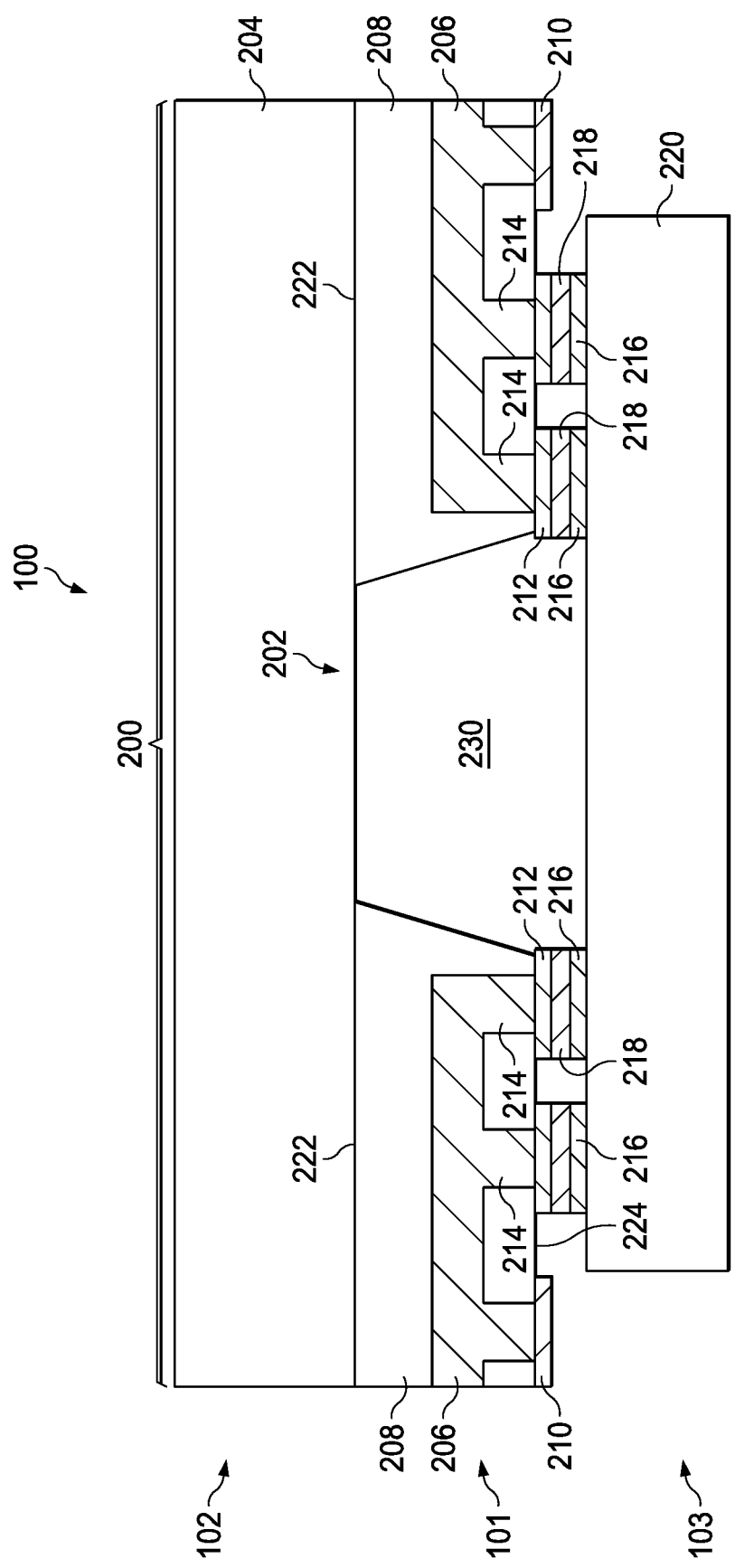
FIG. 2 is a cross-sectional view of an example windowed integrated circuit (IC) package in accordance with teachings of this disclosure shown along a line A-A of FIG. 1B.

FIG. 2 is a cross-sectional view of an example windowed integrated circuit (IC) package (e.g., cut portion, a die portion, a singulated portion, etc.) 200 in accordance with teachings of this disclosure shown along a line A-A of FIG. 1B. In particular, the IC package 200 represents a die assembly singulated from (e.g., cut from, divided from, subdivided from, etc.) the optical wafer assembly 100 of FIG. 1, for example. The IC package 200 of the illustrated example includes an interposer die (e.g., an interposer section, a cut interposer) 202 subdivided from the interposer 101 and a first die (e.g., a cut wafer) 204 subdivided from the first wafer 102, which is implemented as an optical window (e.g., an optically clear layer/material) in this example. The example interposer die 202 includes routing (e.g., buried routing, embedded routing, fabricated routing, buried routing, etc.) 206 disposed within a body (e.g., a substrate body material, etc.) 208. In this example, the interposer 101 and, thus, the interposer die 202 are at least partially composed of ceramic (e.g., a ceramic material, a ceramic substrate, a co-fired ceramic, etc.). Further, the interposer die 202 includes pads (e.g., interconnect pads, grid array pads, etc.) 210 and pads 212 mounted thereto, all of which are electrically coupled to vias (e.g., blind vias, buried vias, etc.) 214 associated with the routing 206. In this example, pads 216 of a second die (e.g., cut wafer) 220, as well as a bond layer (e.g., an interlayer) 218, are operatively coupled to the pads 212.

To provide a mechanical support and/or rigidity between the first die 204 and the second die 220, the interposer die 202 of the illustrated example is coupled and/or bonded to the first die 204 at a first bonded interface at a first side 222 of the interposer die 202 and, likewise, the second die 220 at a second bonded interface at a second side 224 of the interposer die 202. In this example, the second side 224 is on an opposite side of the interposer die 202 from the first side 222. Accordingly, the interposer die 202 acts as a rigidizing support between the first and second dies 204, 220. As a result, the example optical wafer assembly 100 is structurally reinforced. In some other examples, the first die 204 and the second die 220 are also mechanically coupled to one another.

To electrically couple the interposer die 202 and at least one of the first or second dies 204, 220, the interposer die 202 of the illustrated example includes the routing 206 extending therethrough (e.g., extending along multiple directions). In this particular example, the routing 206 is electrically coupled to the pads 212 and, thus, the pads 216 as well as the second die 220. In other words, the example interposer die 202 provides additional routing pathways for the second die 220, thereby enabling the second die 220 to be relatively compact, for example.

In the illustrated example, the IC package 200 is a light transmission-based IC package (e.g., a digital light projector, a light measuring device, etc.). In particular, the first die 204 is implemented as an optical window (e.g., a translucent window layer, a light-transmitting window, a semi-translucent layer or portion, an optical quality window, etc.) with a light transmittance wavelength range between 0.1 micrometers and 1.0 millimeter, for example, while the second die 220 is implemented as an image-processing complementary metal oxide semiconductor(CMOS) wafer. In some examples, the window can be at least partially composed of glass (e.g., borosilicate glass) and/or silicon. Additionally or alternatively, a majority of surface area (e.g., 90% or greater of an interface surface area) between the interposer die 202 and the first die 204 is bonded.

In some examples, the routing 206 includes a buried conductor, such as copper, for example. Termination of the routing 206 may be formed by physical vapor deposition or electrodeposition of different materials, such as gold, copper/nickel/gold, titanium/gold and/or titanium/palladium/platinum, etc., for example. Additionally or alternatively, termination materials such as gold, platinum or palladium, etc. can be implemented. In some examples, internal termination material can be implemented as nickel/gold/indium, indium, tin, or any other appropriate material with a relatively low melting point. In some examples, at least one of the pads 210, 212, 216 is at least partially composed of gold. However, the example materials mentioned are only examples, and any appropriate material can be implemented instead.

In some examples, an inner portion (e.g., an inner volume) 230 is sealed (e.g., hermetically sealed, sealed to a helium leak rate of less than 5

$$5*10^{-8}\frac{\text{atmosphere}*\text{cubic centimeter}}{\text{second}}).$$

In some such examples, at least one of the pads 212 being bonded to the corresponding pads 216 via the bond layer 218 at least partially forms a sealed perimeter and/or hermetic seal ring for the inner portion 230. In other words, the pads 214 and the pads 216, along with the bond layer 218, form a sealed boundary that encloses a volume (e.g., an inner volume, an enclosed volume, etc.) within the IC package 200. Further, additional layering added proximate or below the second die 220 (in the view of FIG. 2) can be used to further seal the inner portion 230. Additionally or alternatively, the pads 210, 212 and/or hermetic seal rings defining the aforementioned sealed perimeter are plated simultaneously to a similar (e.g., a same) height. The aforementioned pads 210, 212 can be inside or outside of the hermetic seal ring, for example.

In some examples, at least one of the pads 210, 212, 216 are bonded by a plasma-activated fusion bond, a hydride based electride material (e.g., gold indium (AuIn)), a solid liquid interdiffusion (SLID) bond, etc. Additionally or alternatively, a solderable finish is implemented. In some examples, the pad 210 is a plated LGA metal pad. In some examples, features and/or surfaces (e.g., external surfaces) of the IC package 200 are used as physical mechanical references (e.g., datums). In some examples, a heat sink or other cooling component is bonded to the second die 220.

Figure 3:
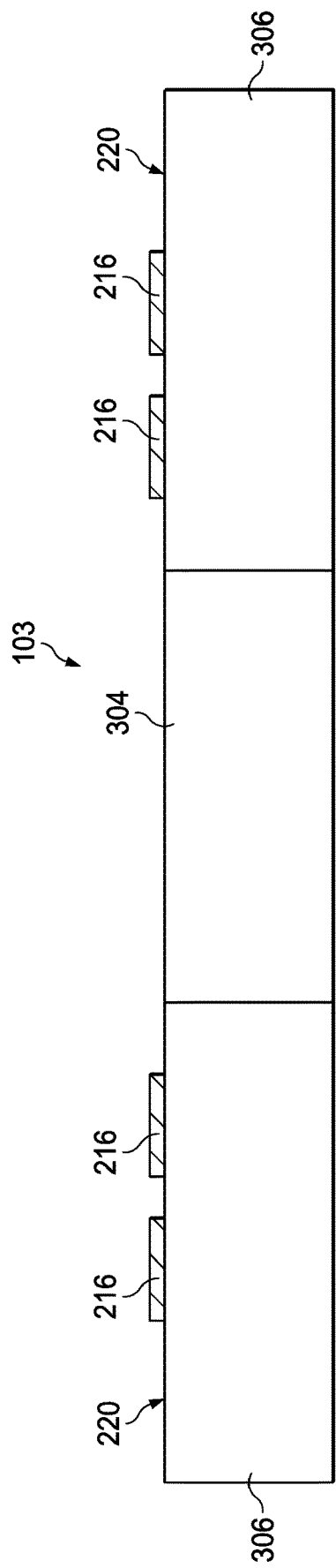
FIG. 3 is a cross-sectional view of an example wafer to produce the windowed IC package of FIG. 2.

FIG. 3 is a cross-sectional view of the example wafer 103 to produce the windowed IC package 200 shown in FIG. 2. In particular, the dies 220 of the IC package 200 are singulated from the wafer 103. In the illustrated example, a cut region 304 is shown disposed between body regions 306, which will subsequently form two of the dies 220 during singulation. In particular, cutting the cut region 304 separates the dies 220.

In some examples, the pads 216 are plated simultaneously at a similar (e.g., a same) thickness. The pads 216 may be positioned inside or outside of a hermetic seal ring, for example. In this example, electrical routing associated with the wafer 103 does not extend through the aforementioned cut region 304. However, in other examples, the electrical routing may extend therethrough.

Figure 4:
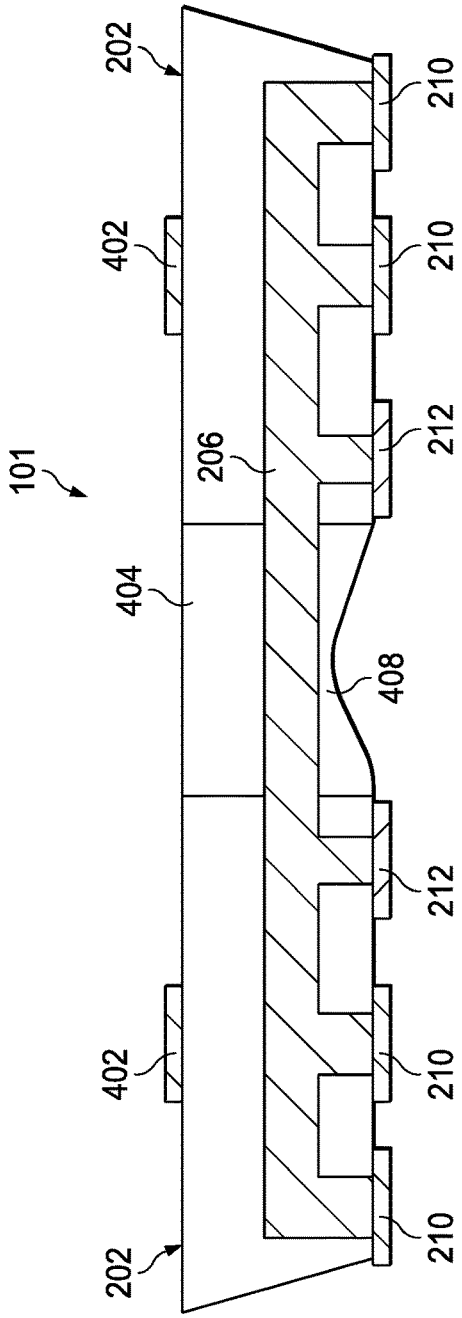
FIG. 4 is a cross-sectional view of an example interposer to produce the IC package of FIG. 2.

FIG. 4 is a cross-sectional view of the example interposer 101 used to produce the IC package 200 shown in FIG. 2. In particular, the example interposer 101 is divided and/or singulated to form multiple ones of the interposer die 202 shown in FIG. 2. In this example, the interposer 101 includes pads 402 and a cut region 404 that is disposed between unseparated ones of the interposer die 202. Further, the example interposer die 202 includes the routing 206 disposed and/or embedded within. In the illustrated example, the routing 206 is routed toward and electrically coupled with the pads 210, 212. While the routing 206 extends through the cut region 404 in this example, the routing 206 may not extend through the cut region 404 in other examples. Additionally or alternatively, the routing 206 is electrically coupled to the pads 402, which form a metallic bond to the wafer 102 (e.g., a metallic and/or anodic bond to an optical window surface of the wafer 102). In other examples, the pads 402 are not implemented and the interposer 101 is only mechanically coupled to the wafer 102.

In some examples, the cut region 404 includes scoring (e.g., a score pattern) 408 to facilitate singulation of the interposer 101 into the discrete interposer dies 202. In some examples, the pads 212 and/or the pads 210 are masked during wafer plating (e.g., to form an LGA interface) for electrical coupling to the wafer 103.

Figure 5:
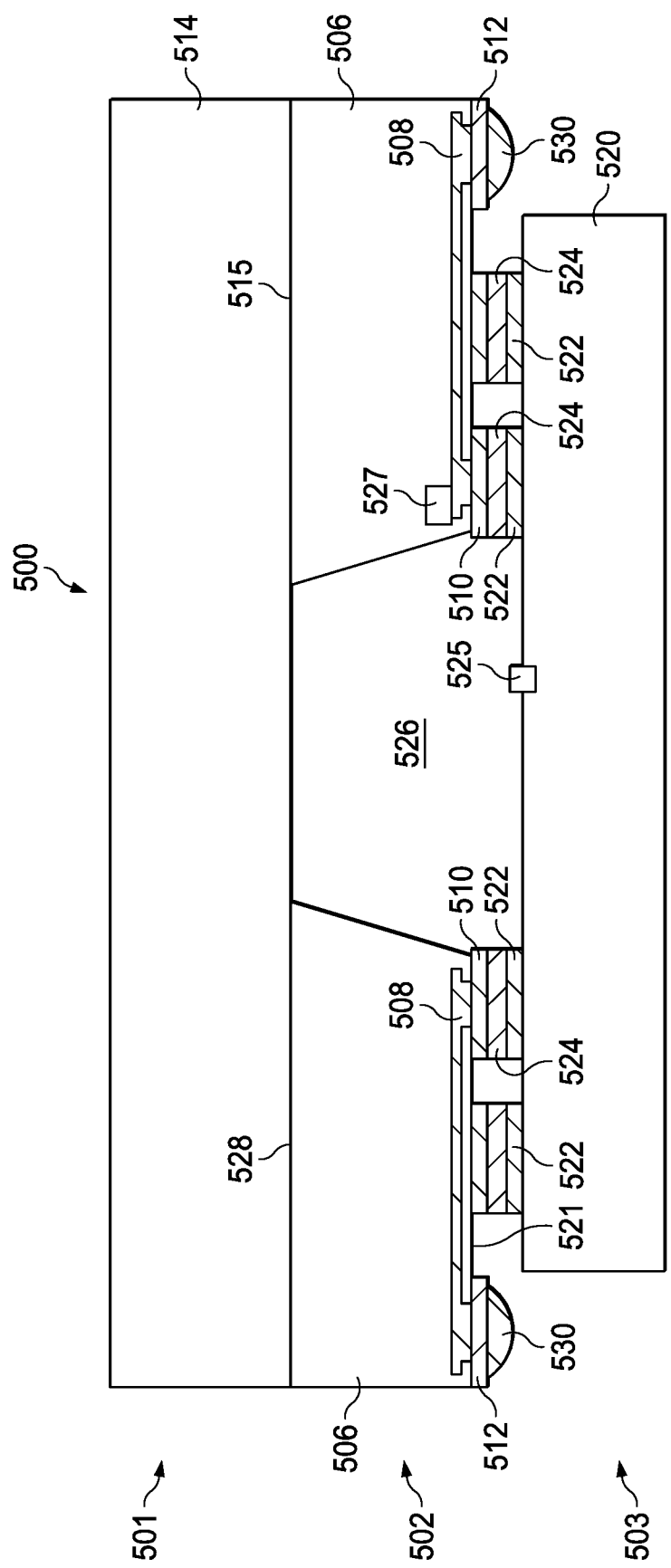
FIG. 5 is a cross-sectional view of an alternative windowed example IC package in accordance with teachings of this disclosure.

FIG. 5 is a cross-sectional view of an alternative example optical IC package 500 in accordance with teachings of this disclosure. The IC package 500 of the illustrated example is formed by a first wafer 501, an interposer 502 and a second wafer 503. In the illustrated example, the IC package 500 includes an interposer die 506, which is at least partially composed of silicon in this example. The interposer die 506 includes routing 508, inner pads 510, and outer pads 512. Further, the example optical IC package 500 includes a first die 514, which is implemented as a semi-translucent (e.g., transparent) layer or window in this example. The example first die 514 is coupled to first bonded interface of a first side 515 of the interposer die 506. Likewise, the example IC package 500 also includes a second die 520 coupled to (e.g., indirectly coupled to) the interposer die 506 at a second bonded interface of a second side 521 of the interposer die 506. The example second die 520 is implemented as a digital micromirror device (DMD) chip. In this example, the second die 520 includes pads 522 that are coupled to the aforementioned pads 510 via an interlayer 524, which can be composed of iridium, for example.

In the illustrated example, a sealed volume (e.g., a hermetically sealed volume) 526 is formed by coupling the first die 514 and the second die 520 to the interposer die 506. In particular, coupling (e.g., bonding) of the pads 510, 522 along with the interlayer 524 forms a bonded perimeter (e.g., a sealed border, a sealed frame, a sealed perimeter, etc.) between the second die 520 and the interposer die 506. Further, a sealed and bonded interface 528 between the first die 520 and the interposer die also forms the sealed volume 526. In some examples, an electromechanical device, such as a micro-electromechanical system (MEMS) device, is disposed within the seal volume 526. In other examples, an electrical device 525 (e.g., a circuit board, a substrate, a die, etc.) is placed within the sealed volume 526. In some such examples, the electrical device 525 can be bonded to a surface within the sealed volume 526 and/or at least partially embedded within the first die 520. Additionally or alternatively, an electrical device 527 is formed and/or embedded within the interposer die 506.

In some examples, external pads (e.g., test interface points, external interface points, etc.) 530 are formed on the pads 510 of the interposer die 506. For example, the external pads 530 can be used for testing electrical functionality of the second die 520. In other examples, the external pads 530 are implemented for electrical signals and/or communications (e.g., digital communications) during operation of the IC package 500. In some examples, the routing 508 includes damascene (e.g., dual damascene copper) or buried metal line(s). Additionally or alternatively, a silicon dioxide/metal/via metal integration scheme is implemented. In some examples, silicon wafers substrates have dummy metal areas to facilitate planarization. In some such examples, the dummy metal areas are removed.

In some examples, thermal insulation is added to the second die 520. In other examples, a thermal cooler (e.g., a heat sink, a thermal gasket, etc.) is coupled to a side of the second die 520. In some examples, an outer surface of the first die 514 and/or an outer surface of the second die 520 forms a mechanical datum and/or a datum reference for production of the IC package 500 and/or assembly of the IC package 500. Moreover, any of the features described above in connection with FIGS. 2-4 can be implemented in this example or other examples, and vice-versa.

Figure 6:
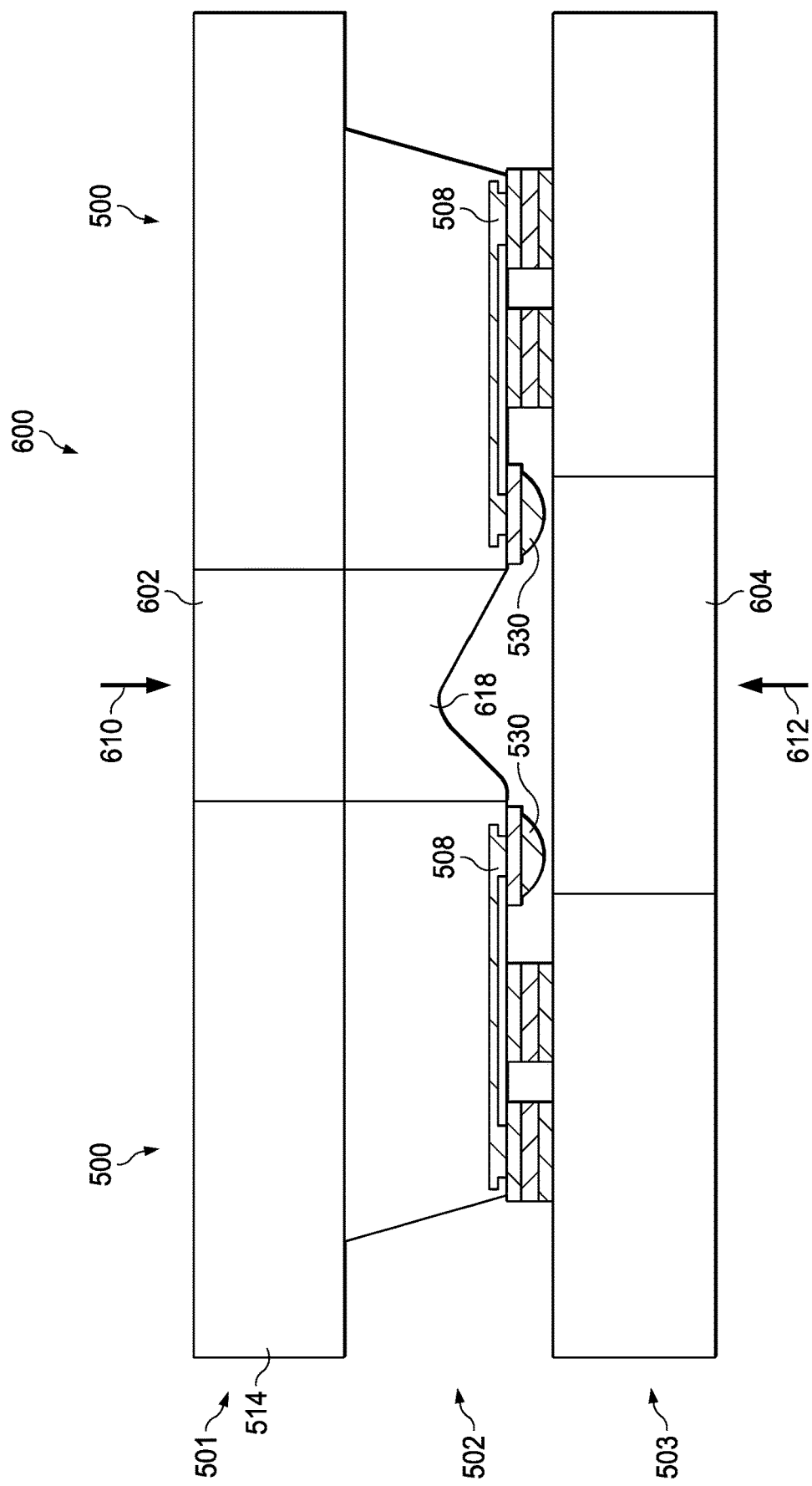
FIG. 6 is a cross-sectional view of an example wafer assembly to form multiple ones of the example windowed IC package of FIG. 5.

FIG. 6 is a cross-sectional view of an example wafer assembly 600 to form multiple ones of the example windowed IC package 500 shown in FIG. 5. The wafer assembly 600 includes the first wafer 501, the interposer 502 and the second wafer 503. In particular, the IC packages 500 are singulated and/or cut from the wafer assembly 600. As can be seen in the illustrated example of FIG. 6, a first cut region 602 and a second cut region 604 is shown.

To test the IC packages 500 while the packages 500 are still coupled to (e.g., attached to) the example wafer assembly 600, the second cut region 604 is cut (e.g., drilled) to expose the external pads 530, for example. In some examples, the second cut region 604 is wider (in the view of FIG. 6) than the first cut region 602 used for singulation of the IC packages 500.

To singulate the IC packages 500 from the wafer assembly 600, the first cut region 602 is cut (e.g., drilled) along a direction generally indicated by an arrow 610 and the second cut region 604 is cut along a direction generally indicated by an arrow 612. In this example, the second cut region 604 is cut first to enable wafer-level testing.

In some examples, the first cut region 602 includes a score (e.g., a score cut) 618 to facilitate singulation of the IC packages 500 from the wafer assembly 600. The score 618 can be round in shape or include straight edges. Further, the score 618 can be formed during a fabrication process, for example. In this example, the routing 508 does not extend through the first cut region 602. However, in other examples, the routing can extend through the first cut region 602.

Figure 7:
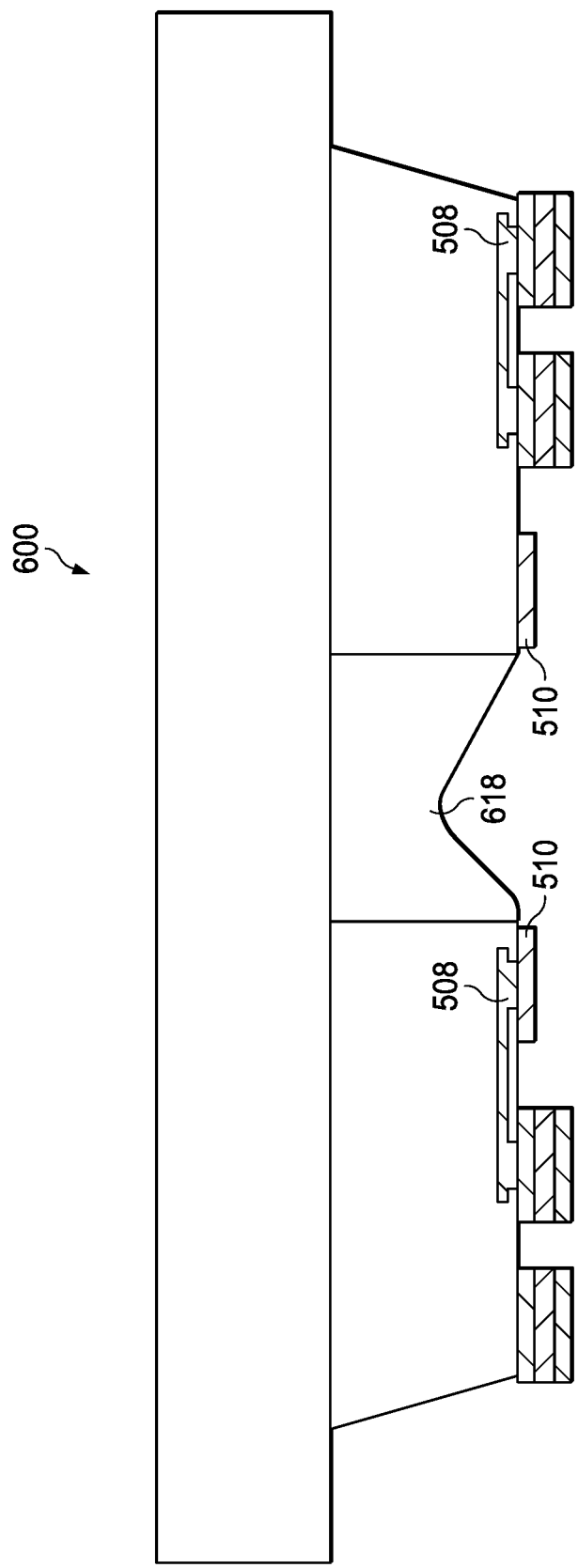
FIG. 7 is a cross-sectional view of a portion of the example wafer assembly of FIG. 6.

Referring to FIG. 7, a portion of the wafer assembly 600 of FIG. 6 is depicted. In particular FIG. 7 depicts a precursor to the wafer assembly 600. In the illustrated example of FIG. 7, the external pads 530 shown in FIGS. 5 and 6 have not been yet coupled to the pads 510. In the illustrated example, the pads 510 are masked during indium plating, bonding, sawing. As a result, an LGA interface is formed thereon.

Figure 8:
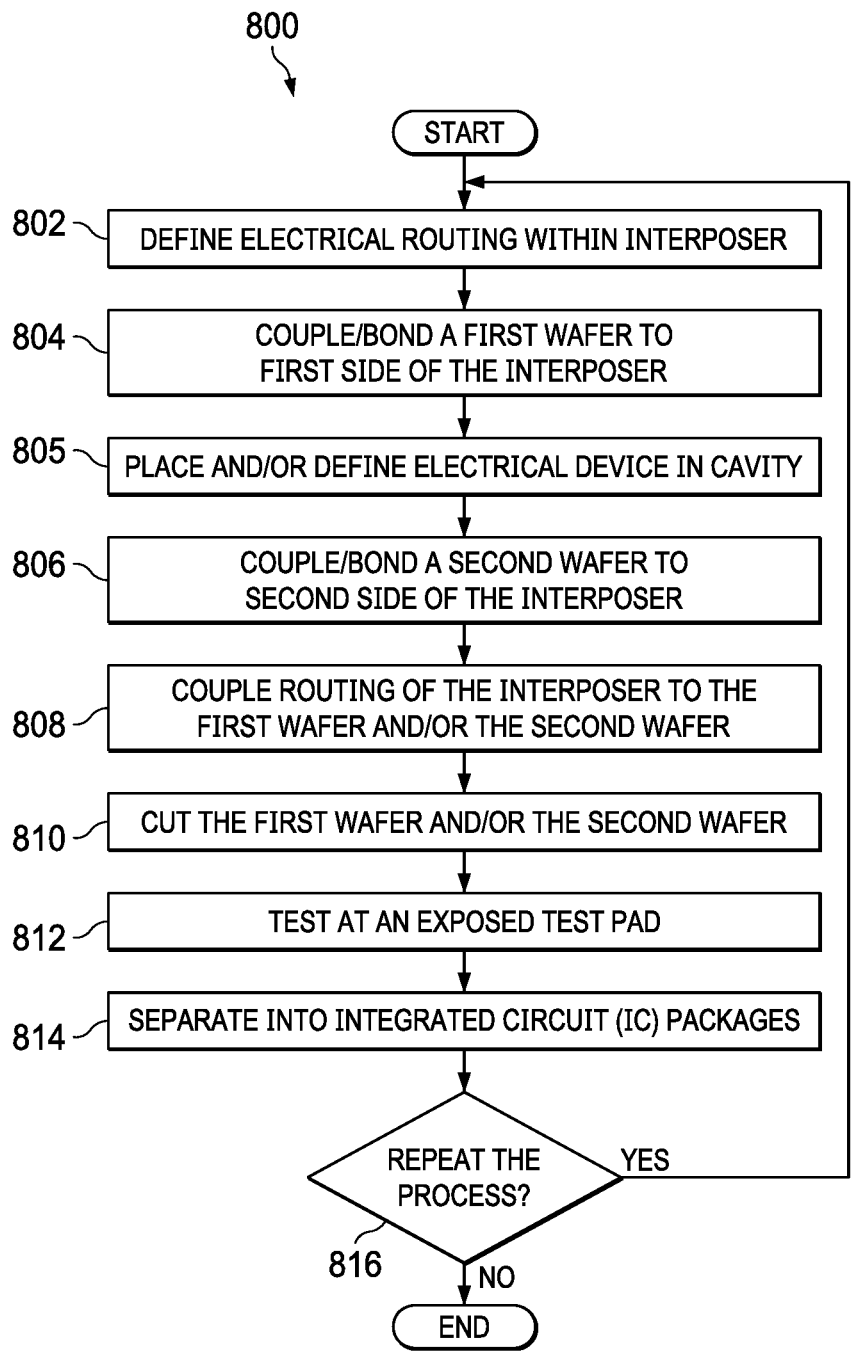
FIG. 8 is a flowchart representative of an example method to produce examples described herein.

FIG. 8 is a flowchart representative of an example method 800 to produce examples described herein. The example method 800 begins as wafers (e.g., the wafers 102, 103, 501, 503) are to be coupled with an interposer (e.g., the interposer 101, the interposer 502) to form a wafer assembly from which multiple IC packages will be singulated.

At block 802, in some examples, electrical routing is formed within the interposer. For example, the electrical routing is embedded within the interposer as buried traces and/or vias, both of which may be formed during a fabrication process. In some examples, the routing extends within a cavity of the interposer. Additionally or alternatively, electrical components are fabricated within the interposer. In other examples, the electrical components are assembled or placed into the interposer.

At block 804, a first wafer of the illustrated example is coupled and/or bonded (e.g., via an inorganic bond, a high temperature fusion bond, etc.) to the interposer at a first side of the interposer. The first wafer can be bonded using any appropriate process and/or coupling method, including, but not limited to, mechanical bonding, adhesive bonding, chemical bonding, metal bonding, anodic bonding, etc. In some examples, at least 90% of an interface between the interposer and the first wafer is bonded. In some examples, an organic bond (e.g., a low-temperature fusion bond) is implemented.

At block 805, in some examples, an electrical device is placed into and/or formed within a cavity formed by the first wafer and the interposer. For example, fabricated component, die and/or printed circuit board can be placed and/or mounted within the cavity.

At block 806, a second wafer is coupled and/or bonded to the interposer at a second side of the interposer to form a wafer assembly. In this example, the second side is on an opposite side of the aforementioned first side and at least one of the first or second wafers includes an optical window in this example. Further, bonding the first and second wafers to the interposer forms a sealed cavity adjacent that is at least partially formed by the optical window.

At block 808, in some examples, routing of the interposer is coupled to at least one of the first or second wafers. This electrical routing coupling can occur by virtue of assembly of the first or second wafer to the interposer. In some examples, the interposer is electrically coupled to only one of the first or second wafers. Additionally or alternatively, the interposer is externally electrically coupled (e.g., via a wire bond process, etc.) to an external device or component.

At block 810, at least one of the first wafer or the second wafer is cut. For example, a partial depth cut is performed to at least partially expose test pads of an IC package of the wafer assembly.

At block 812, in some examples, the IC package is tested at an exposed test pad and/or testing portion. For example, the test pad is exposed by the cut so that a test probe can be brought in contact of the test pad. In other examples, the test pad is exposed without the cut (e.g., based on a geometry or shape of at least one of the first or second wafers).

At block 814, IC packages are separated from the wafer assembly. In other words, the IC packages are singulated from the wafer assembly (e.g., during a cutting process).

At block 816, It is then determined whether to repeat the process. If the process is to be repeated (block 816), control of the process returns to block 802. Otherwise, the process ends.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

From the foregoing, example methods, apparatus and articles of manufacture have been described that enable cost-effective and time-saving implementation of interposers with electrical routing. According to examples described herein, the electrical routing is disposed within an interposer to reduce (e.g., eliminate) a need for expensive and time-consuming post-singulation wire bonding techniques. Further, examples described herein enable more compact and space-saving wafers by providing routing additional electrical routing areas. Some examples described herein also implement relatively low temperature operations, thereby saving energy and, thus, costs associated with high temperature operations.

Modifications are possible in the described embodiments, and other embodiments are possible, within the scope of the claims.

What is claimed is:

1. An integrated circuit (IC) package comprising:
   a first die;
   a second die; and
   an interposer between the first die and the second die, the interposer coupled to the first die at a first surface of the interposer by a first bonded interface, the interposer coupled to the second die at a second surface of the interposer by a second bonded interface, the second bonded interface comprising a first pad, wherein a second pad is on the second surface of the interposer, the interposer comprises electrical routing electrically coupling the first pad to the second pad, and the interposer providing rigidizing support for the first die and the second die, wherein the first bonded interface and the second bonded interface form a sealed cavity between the first die and the second die.

2. The IC package of claim 1, wherein the interposer includes an active electrical device.

3. The IC package of claim 1, wherein the second pad is a test pad adapted to be electrically coupled to a test probe.

4. The IC package of claim 1, wherein the first die includes a complementary metal oxide semiconductor (CMOS) wafer and the second die includes an optical window.

5. The IC package of claim 1, wherein the interposer is at least partially composed of silicon.

6. The IC package of claim 1, wherein the interposer is at least partially composed of a co-fired ceramic material.

7. The IC package of claim 1, wherein the sealed cavity is hermetically sealed.

8. A method of producing an optical wafer assembly, the method comprising:
   coupling a first wafer to a first surface of an interposer to form a first bonded interface; and
   coupling a second wafer to a second surface of the interposer to form a second bonded interface, the second bonded interface comprising a first pad, wherein a second pad is on the second surface of the interposer, the interposer comprises electrical routing electrically coupling the first pad to the second pad, and the interposer providing rigidizing support for the first wafer and the second wafer, wherein the first bonded interface and the second bonded interface form a sealed cavity between the first wafer and the second wafer.

9. The method of claim 8, wherein the second pad is a test pad, the method further including cutting at least one of the first or second wafers to expose the test pad.

10. The method of claim 9, wherein the first wafer is cut with a first cut, and wherein the second wafer is cut with a second cut wider than the first cut to expose the test pad.

11. The method of claim 8, further including defining or placing an active electrical device within the interposer.

12. The method of claim 8, wherein the sealed cavity is hermetically sealed.

13. A device comprising:
   a first die;
   a second die;
   an interposer having a first surface and a second surface, the first surface on the first die and the second surface on the second die, wherein the interposer comprises electrical routing, and the interposer providing rigidizing support for the first die and the second die;
   a first bonded interface between the first die and the interposer; and
   a second bonded interface between the second die and the interposer, the second bonded interface comprising a first pad, a second pad on the second surface of the interposer, the electrical routing electrically coupling the first pad to the second pad, wherein the first bonded interface and the second bonded interface form a sealed cavity between the first die and the second die.

14. The device of claim 13, wherein the interposer includes active electrical components.

15. The device of claim 13, wherein the first die is at least partially composed of borosilicate glass.

16. The device of claim 13, wherein the interposer is at least partially composed of a co-fired ceramic.

17. The device of claim 13, wherein the interposer includes score cuts to facilitate separation of integrated circuit (IC) packages.

18. The IC package of claim 1, wherein the second pad is outside the sealed cavity.

19. The device of claim 13, wherein the second pad is outside the sealed cavity.

* * * * *